(12) United States Patent
Zama et al.

(10) Patent No.: US 11,159,718 B2
(45) Date of Patent: Oct. 26, 2021

(54) IMAGING METHOD

(71) Applicant: TOYOTA JIDOSHA KABUSHIKI KAISHA, Toyota (JP)

(72) Inventors: Kazuhiro Zama, Nagoya (JP); Taisuke Nomiyama, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/851,968

(22) Filed: Apr. 17, 2020

(65) Prior Publication Data

US 2020/0244876 A1 Jul. 30, 2020

Related U.S. Application Data

(63) Continuation of application No. 16/163,791, filed on Oct. 18, 2018, now Pat. No. 10,674,073.

(30) Foreign Application Priority Data

Oct. 25, 2017 (JP) .............................. JP2017-206185

(51) Int. Cl.
*H04N 5/232* (2006.01)
*H01L 27/146* (2006.01)
*H04N 5/235* (2006.01)
*H04N 9/04* (2006.01)

(52) U.S. Cl.
CPC ... *H04N 5/23232* (2013.01); *H01L 27/14609* (2013.01); *H01L 27/14621* (2013.01); *H04N 5/2354* (2013.01); *H04N 5/2355* (2013.01); *H04N 9/045* (2013.01); *H04N 9/04551* (2018.08)

(58) Field of Classification Search
CPC .................................................. H04N 5/23232
USPC ........................................................... 348/272
See application file for complete search history.

(56) References Cited

U.S. PATENT DOCUMENTS

| 6,125,818 A * | 10/2000 | Okamoto ........... F02M 51/0671 |
| | | 123/305 |
| 9,129,388 B2 * | 9/2015 | Finlayson ................. G06T 5/40 |
| 2009/0118578 A1 * | 5/2009 | Takasugi ............... A61B 5/0084 |
| | | 600/109 |

(Continued)

FOREIGN PATENT DOCUMENTS

| JP | 2016-049124 A | 4/2016 |
| JP | 2017-511176 A | 4/2017 |
| WO | 2015/142800 A1 | 9/2015 |

*Primary Examiner* — Joel W Fosselman
(74) *Attorney, Agent, or Firm* — Sughrue Mion, PLLC

(57) ABSTRACT

An imaging method includes irradiating an object, from an irradiator, with mixed light of light in a first wavelength band and light in a second wavelength band having an intensity higher than an intensity of the first wavelength band, the first wavelength band being a wavelength band correlating with a first filter having a first transmission wavelength characteristic, and the second wavelength band being a wavelength band correlating with a second filter having a second transmission wavelength characteristic different from the first transmission wavelength characteristic; imaging the object irradiated with the mixed light by using the imaging element; and generating composite image data by high dynamic range synthesis of first layer image data and second layer image data, among image data of the object output by the imaging element.

5 Claims, 9 Drawing Sheets

(56) References Cited

U.S. PATENT DOCUMENTS

2015/0244995 A1* 8/2015 Sekiguchi ............... H04N 9/04
348/164
2017/0122869 A1 5/2017 Yoshikawa

* cited by examiner

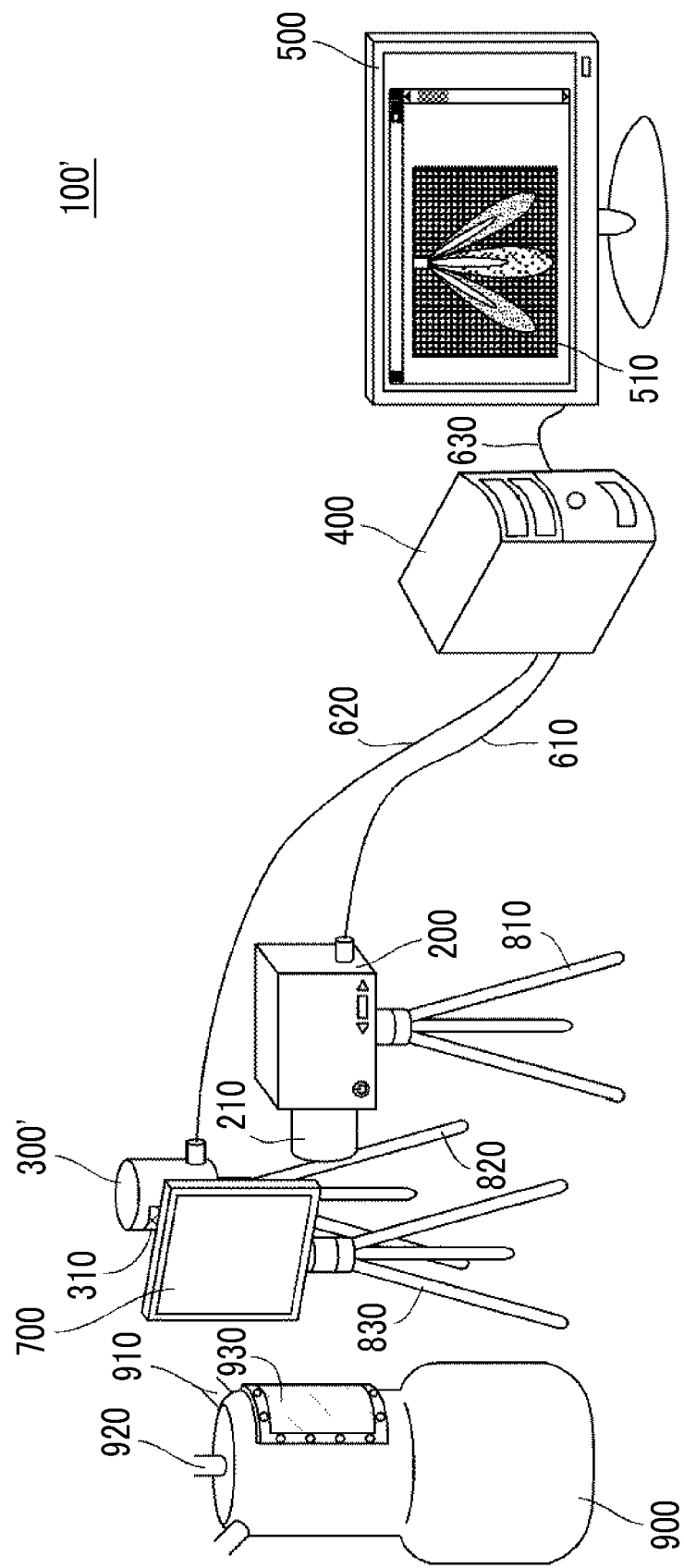

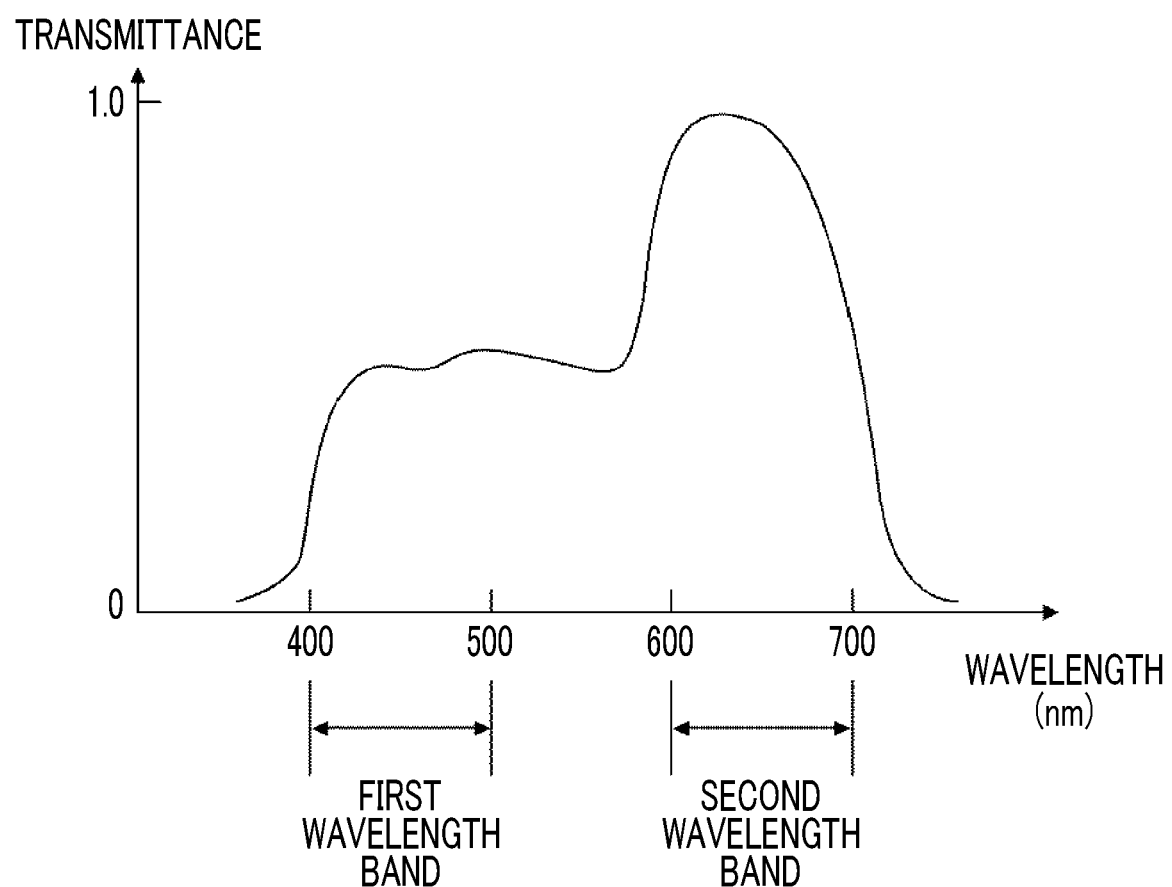

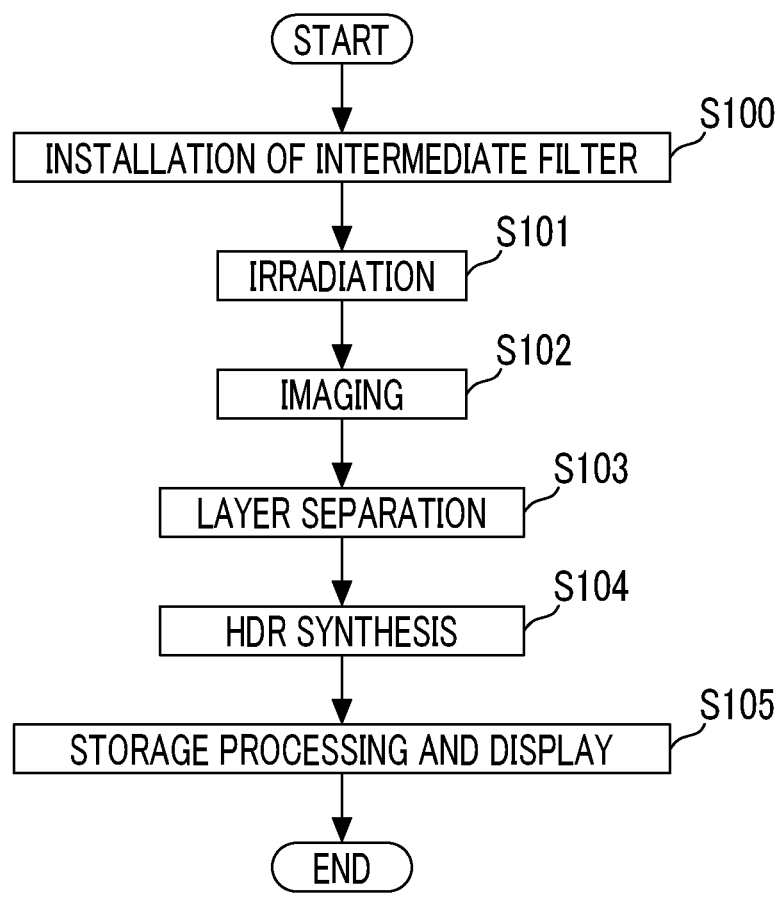

IMAGING METHOD

INCORPORATION BY REFERENCE

The disclosure is a continuation of U.S. application Ser. No. 16/163,791, filed Oct. 18, 2018, which claims priority to Japanese Patent Application No. 2017-206185 filed on Oct. 25, 2017 including the specification, drawings and abstract which are incorporated herein by reference in their entireties.

BACKGROUND

1. Technical Field

The of the disclosure relates to an imaging method of an object with a large contrast difference.

2. Description of Related Art

In a case of capturing an image of an object with a large contrast difference by using an imaging element having a limited dynamic range, a high dynamic range (HDR) synthesis technology in which an image is captured once by matching an exposure to a bright object area, an image is captured once again by matching the exposure to a dark object area, and the two captured images are combined, is known (See Japanese Unexamined Patent Application Publication No. 2016-49124 (JP 2016-49124 A)).

SUMMARY

In a case where imaging is performed by irradiating a rapidly changing object with strong light, a large contrast difference occurs between object areas; however, combining two images obtained by two imaging operations decreases the number of images acquired per unit time.

The disclosure provides an imaging method that increases the number of images acquired per unit time by suppressing as much as possible the occurrence of blown-out highlights and blocked-up shadows on an object with a large contrast difference.

A first aspect of the disclosure relates to an imaging method. The imaging method includes irradiating an object, from an irradiator, with mixed light of light in a first wavelength band and light in a second wavelength band having an intensity higher than an intensity of the first wavelength band; imaging the object irradiated with the mixed light by using the imaging element; and generating composite image data by high dynamic range synthesis of first layer image data and second layer image data, among image data of the object output by the imaging element. The first wavelength band is a wavelength band correlating with a first filter having a first transmission wavelength characteristic among optical filters disposed in each of a plurality of pixels constituting an imaging element in an imaging device, and the second wavelength band is a wavelength band correlating with a second filter having a second transmission wavelength characteristic different from the first transmission wavelength characteristic. The first layer image data is image data generated based on an output signal of a pixel in which the first filter is disposed, and the second layer image data is image data generated based on an output signal of a pixel in which the second filter is disposed.

According to the first aspect of the disclosure, by one imaging operation, the first layer image data that favorably reproduces a tone of a relatively bright object area and the second layer image data that favorably reproduces a tone of a relatively dark object area can be obtained. When the first layer image data and the second layer image data are subjected to HDR synthesis, image data in which blown-out highlights and blocked-up shadows are reduced can be obtained. Since one piece of image data can be obtained by the one imaging operation, the number of images acquired per unit time can be increased.

A second aspect of the disclosure relates to an imaging method. The imaging method includes disposing an intermediate filter having a transmittance in a second wavelength band higher than a transmittance in a first wavelength band, between a light source and an object; imaging the object irradiated with irradiation light from the light source which has been transmitted through the intermediate filter by using the imaging element; and generating composite image data by high dynamic range synthesis of first layer image data and second layer image data, among image data of the object output by the imaging element. The first wavelength band is a wavelength band correlating with a first filter having a first transmission wavelength characteristic among optical filters disposed in each of a plurality of pixels constituting an imaging element in an imaging device, and the second wavelength band is a wavelength band correlating with a second filter having a second transmission wavelength characteristic different from the first transmission wavelength characteristic. The first layer image data is image data generated based on an output signal of a pixel in which the first filter is disposed, and the second layer image data is image data generated based on an output signal of a pixel in which the second filter is disposed.

According to the second aspect of the disclosure, as in the first aspect, by one imaging operation, the first layer image data that favorably reproduces a tone of a relatively bright object area and the second layer image data that favorably reproduces a tone of a relatively dark object area can be obtained. When the first layer image data and the second layer image data are subjected to HDR synthesis, image data in which the blown-out highlights and the blocked-up shadows are reduced can be obtained. Since one piece of image data can be obtained by the one imaging operation, the number of images acquired per unit time can be increased.

In each of the imaging methods according to the first aspect and the second aspect of the disclosure, the first filter may be one of an Red filter, a Green filter, and a Blue filter, the second filter may be one different from the first filter among the Red filter, the Green filter, and the Blue filter, and when the composite image data is generated by the high dynamic range synthesis of the first layer image data and the second layer image data, the image data may be generated as grayscale image data. Typically, any one of the Red filter, the Green filter, and the Blue filter is disposed in each pixel of the imaging element provided in the imaging unit, and therefore, it is possible to use a general-purpose imaging unit by utilizing the difference in the transmission wavelength characteristics. In each of the imaging methods of the first aspect and the second aspect of the disclosure, the first filter may be the Green filter or the Blue filter, and the second filter may be the Red filter. The association as described above is desirable in a case of imaging microparticles where Mie scattering is observed.

In each of the imaging methods according to the first aspect and the second aspect of the disclosure, particularly, the object may be fuel spray of an internal combustion engine. In a case where the object is the fuel spray of the internal combustion engine, the imaging method as described above is effective. When the sprayed fuel is irradiated with light, the Mie scattering occurs and the sprayed fuel is observed as gray shade in the first place. Therefore, even when the optical filter disposed in the pixel of the imaging element is used as a light quantity adjusting mechanism that transmits light in a specific wavelength band, a composite image to be generated does not cause a sense of discomfort.

According to the first aspect and the second aspect of the disclosure, it is possible to increase the number of images acquired per unit time while suppressing as much as possible the occurrence of the blown-out highlights and the blocked-up shadows on the object with the large contrast difference.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 9 is a schematic view illustrating an overall configuration of an imaging system according to a second embodiment;

FIG. 10 is a graph illustrating a transmission wavelength characteristic of an intermediate filter; and FIG. 11 is a flowchart illustrating a series of imaging steps according to the second embodiment.

DETAILED DESCRIPTION OF EMBODIMENTS

Hereinafter, the disclosure will be described through embodiments, but the disclosure according to the claims is not limited to the following embodiments. All of the configurations described in the embodiments are not indispensable as means for solving the problem.

Figure 1:
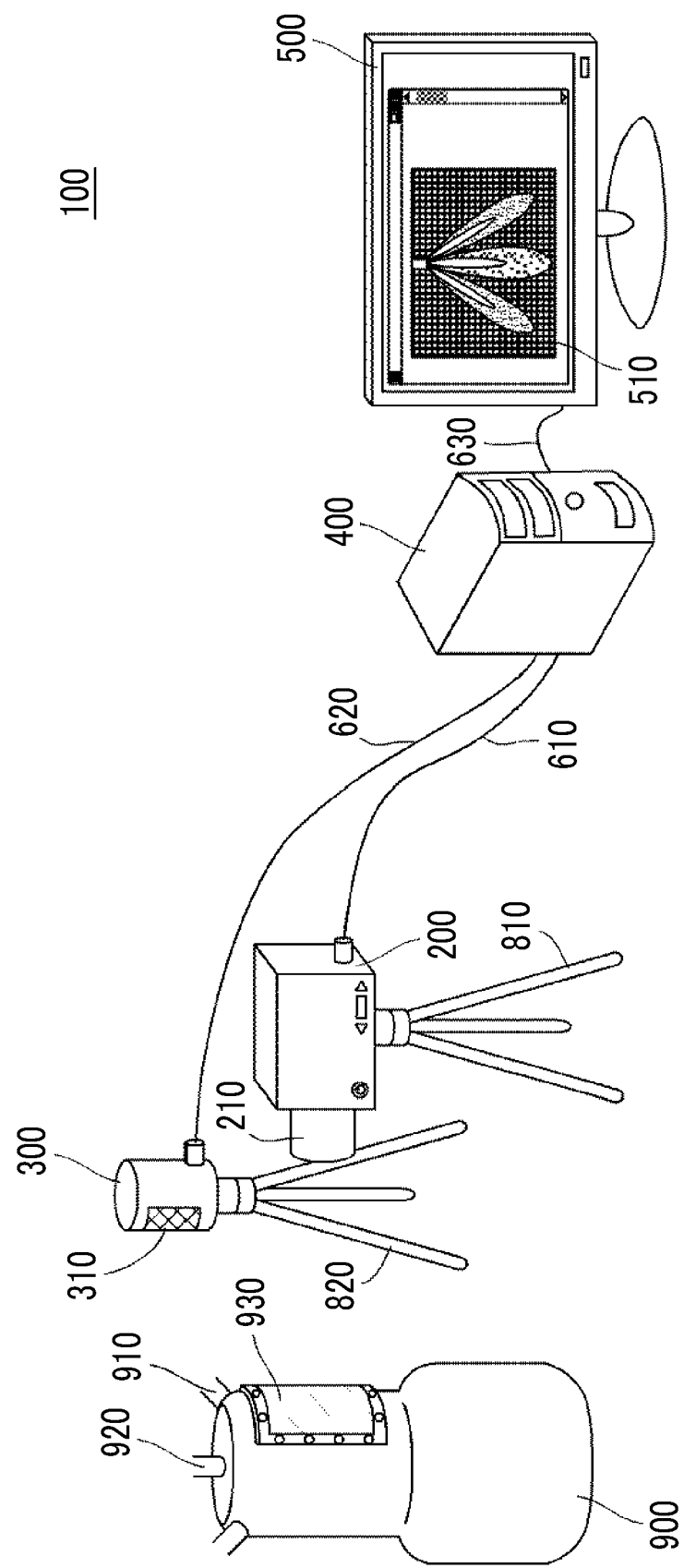
FIG. 1 is a schematic view illustrating an overall configuration of an imaging system according to a first embodiment.

FIG. 1 is a schematic view illustrating an overall configuration of an imaging system 100 according to a first embodiment. In the first embodiment, on the inside of an internal combustion engine 900, the imaging system 100 images a state in which fuel introduced from a valve 910 is atomized to explode by being ignited by a spark plug 920, through an observation window 930 formed by hollowing out a part of a cylinder and covered with tempered glass. It is desirable that a surface of the observation window 930 is subjected to antireflection treatment by thin film coating or the like.

The imaging system 100 mainly includes an imaging unit 200, a flash 300, a control personal computer (PC) 400, and a monitor 500. The imaging unit 200 is a device that photoelectrically converts an object image and outputs image data. The imaging unit 200 is erected by a tripod 810, and a lens 210 constituting the imaging unit 200 is directed to the observation window 930. That is, the imaging unit 200 is disposed to image the inside of the internal combustion engine 900. The imaging unit 200 is an example of an imaging device.

The flash 300 is a device that generates flash light for irradiating an object. The flash 300 is erected by a tripod 820, and an irradiation window 310 from which irradiation light is emitted is directed to the observation window 930. That is, the flash 300 is disposed to irradiate the inside of the internal combustion engine 900. The flash 300 is an example of an irradiator.

For example, the control PC 400 controls imaging processing of the imaging unit 200 through a cable 610 which is a universal serial bus (USB) cable, and acquires the image data output from the imaging unit 200. Connection between the imaging unit 200 and the control PC 400 may be a wireless connection using a wireless local area network (LAN) or the like instead of a wired connection using the cable 610, or may be a remote connection via a network. The control PC 400 controls light emission timing and light emission intensity of the flash 300, through a cable 620 which is a USB cable. Connection between the flash 300 and the control PC 400 may be the wireless connection using the wireless LAN or the like, instead of a wired connection using the cable 620, or may be the remote connection via the network. The control PC 400 processes the acquired image data to generate composite image data described later. Details will be described later.

The monitor 500 is, for example, a display device having a liquid crystal panel, receives a display signal sent from the control PC 400 through a cable 630, and converts the display signal into a visible image to display the image. For example, as illustrated in the figure, the image data captured by the imaging unit 200 is visualized and displayed as a display image 510. Connection between the monitor 500 and the control PC 400 may be the wireless connection using the wireless LAN or the like, instead of a wired connection using the cable 630, or may be the remote connection via the network.

Figure 2:
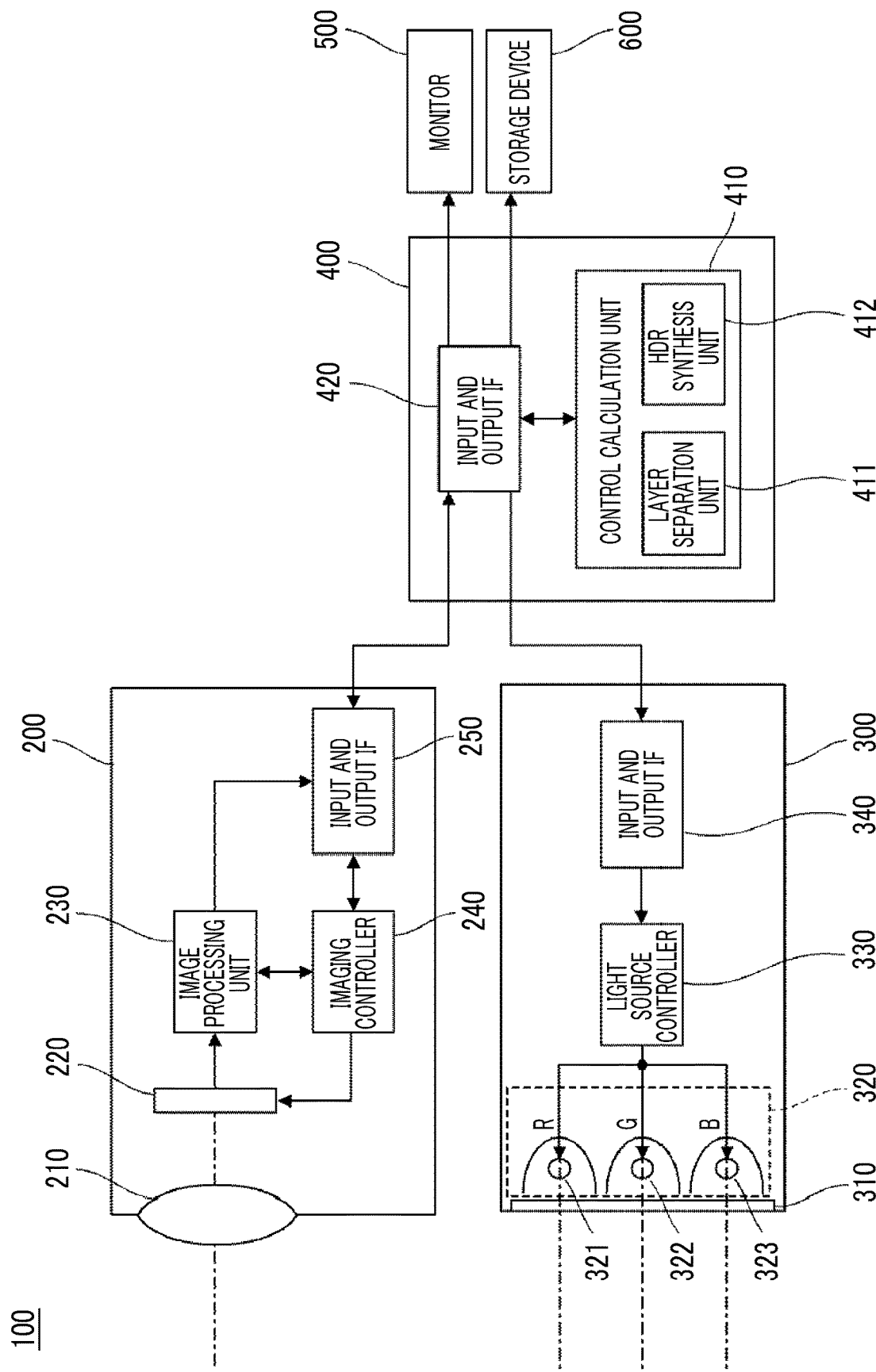
FIG. 2 is a block diagram illustrating a system configuration.

FIG. 2 is a block diagram illustrating a system configuration of the imaging system 100. In addition to the lens 210, the imaging unit 200 mainly includes an imaging element 220, an image processing unit 230, an imaging controller 240, and an input and output interface (IF) 250. The lens 210 forms an image of light flux from the object on a light receiving surface of the imaging element 220. The lens 210 may be composed of a plurality of lenses.

The imaging element 220 is, for example, a complementary metal oxide semiconductor (CMOS) image sensor, and photoelectrically converts an optical image formed on the light receiving surface to output a pixel signal. The pixel signal output from the imaging element 220 is delivered to the image processing unit 230. The image processing unit 230 performs analog digital (AD) conversion on the pixel signal, performs predetermined processing, and generates the image data.

Reset timing and charge accumulation time of the imaging element 220 are controlled by the imaging controller 240. Image data generation by the image processing unit 230 and output of the generated image data are also controlled by the imaging controller 240. The input and output IF 250 is an input and output interface for receiving a control signal from the control PC 400 and sending the image data or a response signal to the control PC 400. The input and output IF 250 is, for example, a USB interface. The image data generated by the image processing unit 230 is output from the input and output IF 250 to the control PC 400 under the control of the imaging controller 240.

In addition to the irradiation window 310, the flash 300 mainly includes a light source 320, a light source controller 330, and an input and output IF 340. The irradiation window 310 is an optical panel that transmits the irradiation light emitted from the light source 320. The irradiation window 310 may have an optical function of diffusing or converging the irradiation light.

The light source 320 includes an R light source 321 that generates red light, a G light source 322 that generates green light, and a B light source 323 that generates blue light. Each of the light sources is constituted by, for example, a high-luminance light emitting diode (LED). Each of the light sources may be constituted by a plurality of LEDs, and in a case where the light sources are constituted by the LEDs, the light sources of the respective colors may be alternately arranged in a plane. The intensity of the irradiation light emitted from each light source is controlled by the light source controller 330. The light source controller 330 controls the intensity of the irradiation light of each color according to the control signal sent from the control PC 400 through the input and output IF 340.

The control PC 400 mainly includes a control calculation unit 410 which is a central processing unit (CPU) and an input and output IF 420 which is a USB interface, for example. The control calculation unit 410 generally controls the imaging system 100 and processes the image data acquired from the imaging unit 200 to generate the composite image data. Specifically, the control calculation unit 410 includes a layer separation unit 411 and an HDR synthesis unit 412 as function calculation units. The layer separation unit 411 separates the image data acquired from the imaging unit 200 for each layer image data correlating with an optical filter. The HDR synthesis unit 412 performs interpolation processing and synthesis processing on the layer image data separated by the layer separation unit 411 to generate composite image data representing one grayscale image. Specific processing will be described later.

The control calculation unit 410 converts the image data acquired from the imaging unit 200, the generated composite image data, or the like into display signals and sends the display signals to the monitor 500 through the input and output IF 420. The control calculation unit 410 stores the image data acquired from the imaging unit 200, the generated composite image data, or the like in a storage device 600 through the input and output IF 420. The storage device 600 is a nonvolatile storage medium, and is, for example, a hard disk drive (HDD). The storage device 600 may be a type of data center connected to the network.

Figure 3:
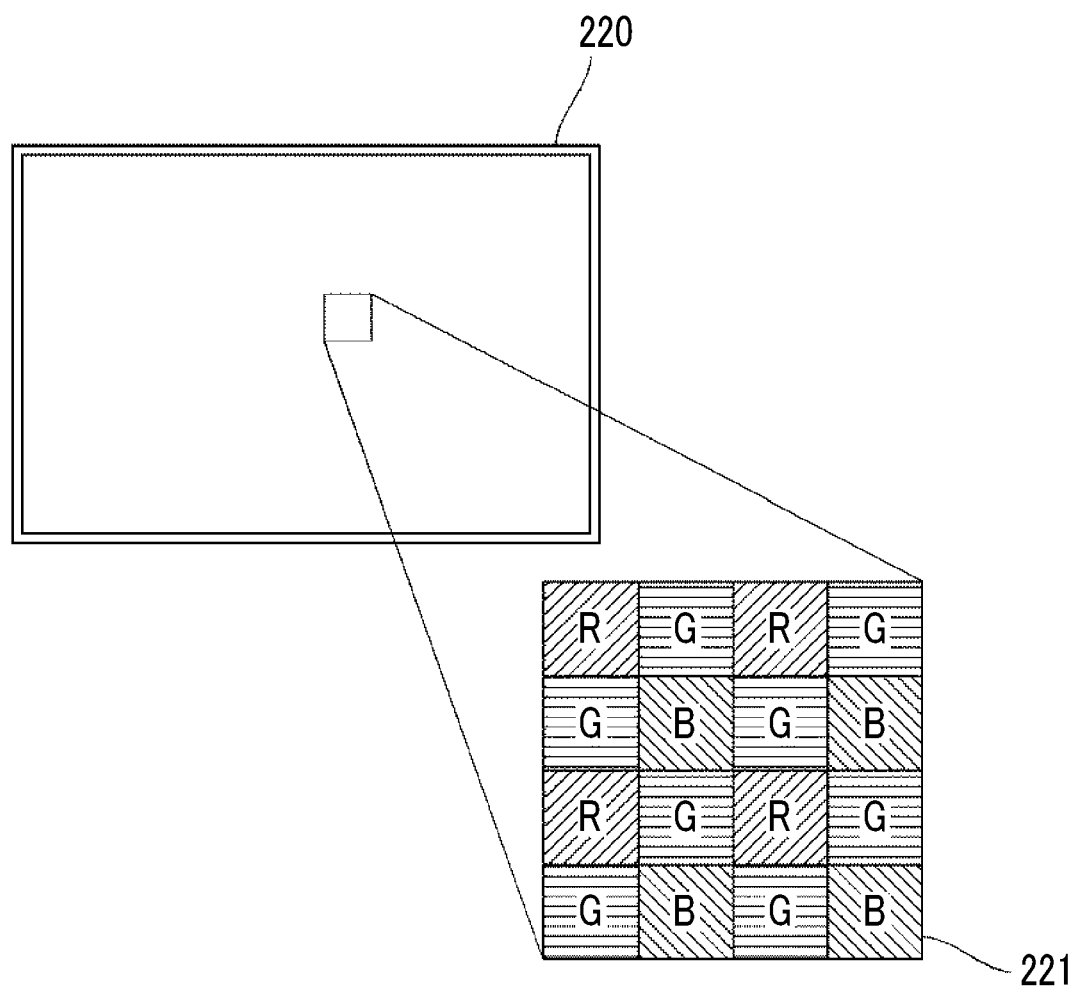
FIG. 3 is a diagram illustrating a pixel arrangement of an imaging element.

FIG. 3 is a diagram illustrating a pixel arrangement of the imaging element 220. The imaging element 220 has a structure in which a plurality of pixels having a photodiode (PD) which is a photoelectric conversion element as a main constituent element is two-dimensionally arranged. In each pixel, the optical filter colored in any one of red, green, and blue is disposed so as to cover the PD. That is, the optical filter is a RGB filter configured by a Red filter, a Green filter and a Blue filter. For example, as illustrated as an enlarged portion in FIG. 3, the optical filter has a repeated structure having four pixels as a set. In the repeated structure, a so-called Bayer array in which the Red filter is disposed in the upper left pixel, the Blue filter is disposed in the lower right pixel, and the Green filter is disposed in each of the remaining two pixels, is adopted.

Figure 4:
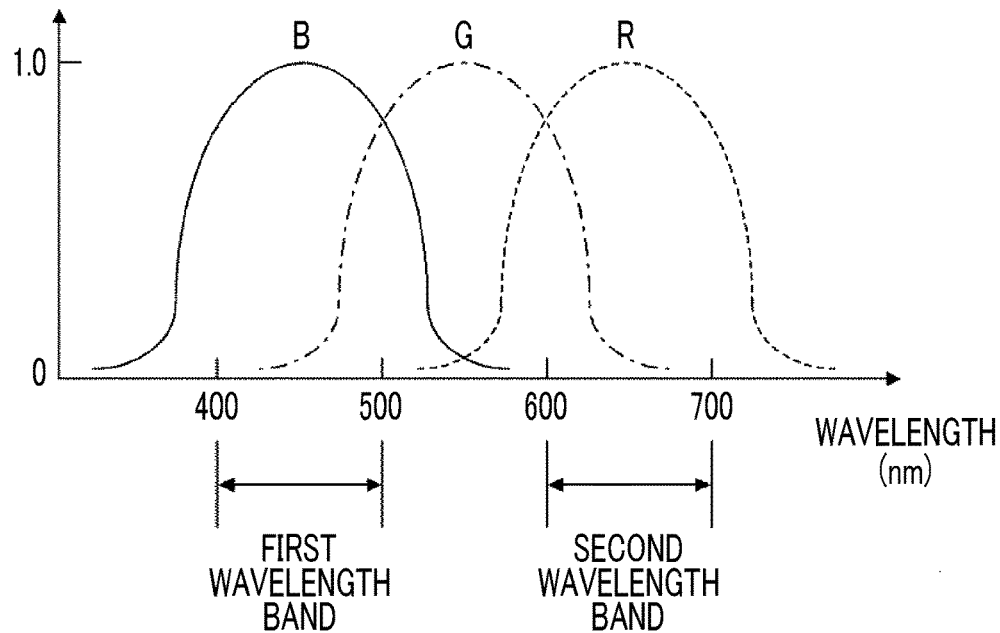
FIG. 4 is a graph illustrating transmission wavelength characteristics of optical filters.

FIG. 4 is a graph illustrating transmission wavelength characteristics of optical filters of the imaging element 220. In FIG. 4, the horizontal axis represents a wavelength (nm) and the vertical axis represents a transmittance. Each of the RGB filters has a different transmission wavelength characteristic.

As indicated by the solid line, the Blue filter has a transmission wavelength characteristic that mainly transmits wavelengths from 400 nm to 500 nm and largely blocks other wavelengths. As indicated by a one-dot chain line, the Green filter has a transmission wavelength characteristic that mainly transmits wavelengths from 500 nm to 600 nm and largely blocks other wavelengths. As indicated by the dotted line, the Red filter has a transmission wavelength characteristic that mainly transmits wavelengths from 600 nm to 700 nm and largely blocks other wavelengths. In the first embodiment, a wavelength band of wavelengths from 400 nm to 500 nm mainly transmitted by the Blue filter is set as a first wavelength band, and a wavelength band of wavelengths from 600 nm to 700 nm mainly transmitted by the Red filter is set as a second wavelength band. That is, the first wavelength band correlates with the transmission wavelength characteristic of the Blue filter, and the second wavelength band correlates with the transmission wavelength characteristic of the Red filter.

Figure 5:
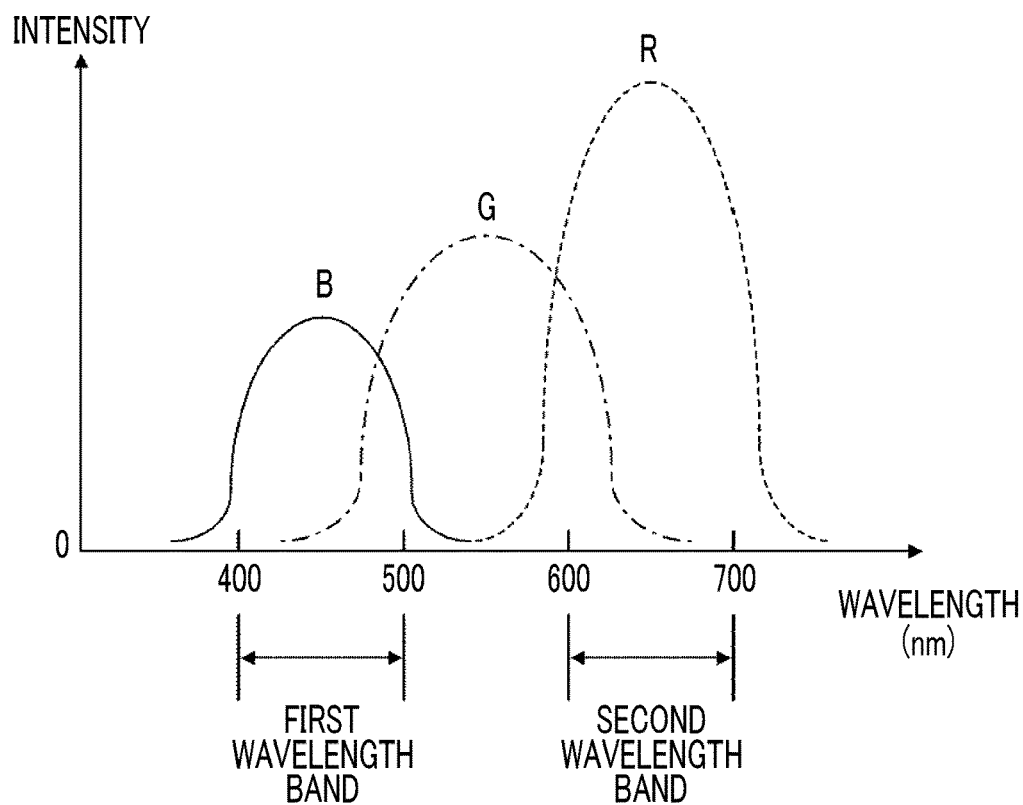
FIG. 5 is a graph illustrating a relationship between a wavelength band and an intensity of irradiation light.

FIG. 5 is a graph illustrating a relationship between a wavelength band and an intensity of the irradiation light of the light source 320 adjusted by the light source controller 330. In FIG. 5, the horizontal axis represents the wavelength (nm) and the vertical axis represents the intensity.

The irradiation light B indicated by the solid line shows the relationship between the wavelength band and the intensity of the irradiation light emitted from the B light source 323. The irradiation light B is light correlating with the first wavelength band and has a peak intensity at about 450 nm. The irradiation light G indicated by a one-dot chain line shows the relationship between the wavelength band and the intensity of the irradiation light emitted from the G light source 322. The irradiation light G has a peak intensity at about 550 nm. The irradiation light R indicated by the dotted line shows the relationship between the wavelength band and the intensity of the irradiation light emitted from the R light source 321. The irradiation light R is light correlating with the second wavelength band and has a peak intensity at about 650 nm.

The irradiation light emitted from the irradiation window 310 is mixed light of light emitted from the three light sources of the B light source, the G light source, and the R light source. As illustrated in the figure, the light source controller 330 adjusts the output of the light source 320 such that the intensity of the second wavelength band is higher than the intensity of the first wavelength band. In the example of FIG. 5, the peak intensity at about 650 nm in the second wavelength band is higher than the peak intensity at about 450 nm in the first wavelength band. The comparison of the intensities between the respective wavelength bands may be based on the peak intensities in the respective wavelength bands, and may be based on integration values included in the respective wavelength bands.

Figure 6:
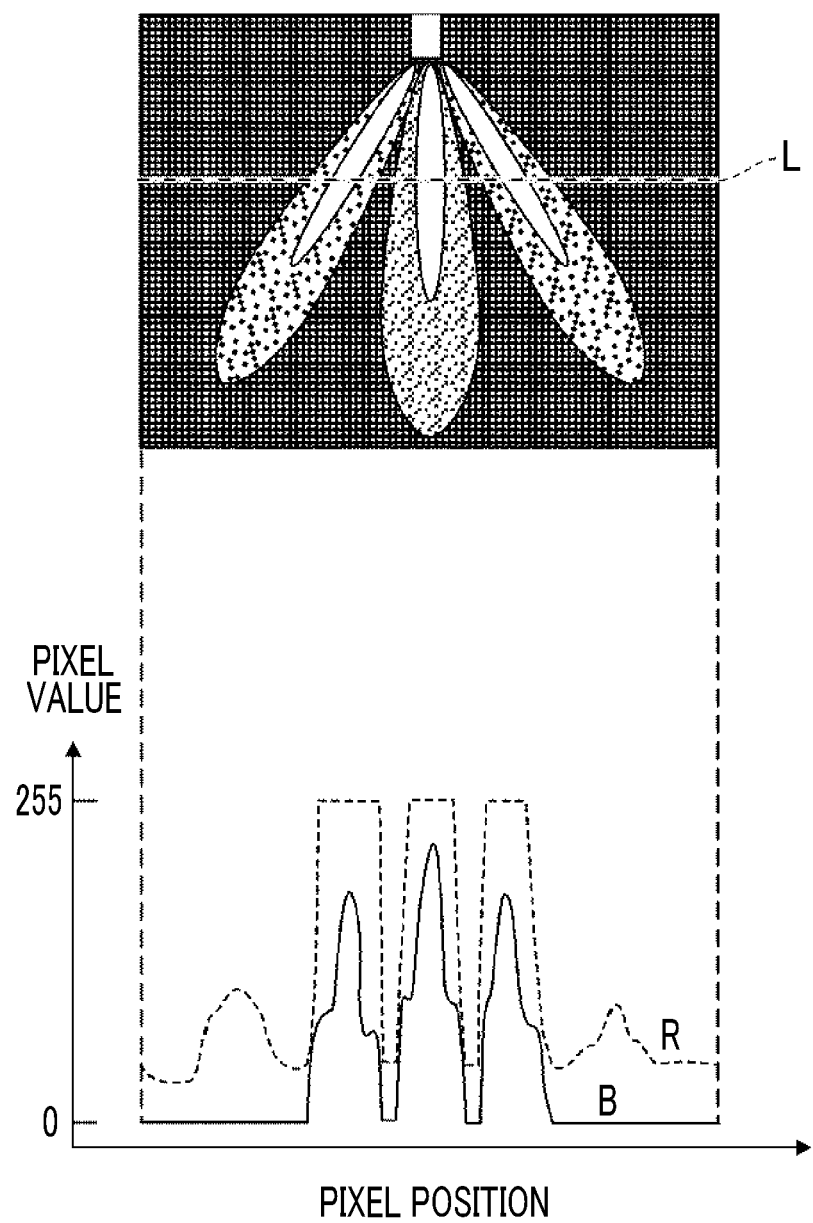
FIG. 6 is a diagram illustrating a relationship between an appearance of an object and two layer images according to the first embodiment.

FIG. 6 is a diagram illustrating a relationship between an appearance of the object and two layer images according to the first embodiment observed through the observation window 930. The upper diagram of FIG. 6 shows the appearance of the object according to the first embodiment. Specifically, the upper diagram of FIG. 6 shows a state where the fuel is introduced from the valve 910 and atomized. The state is equivalent to a virtual image acquired by irradiating an object with uniform white light and normally imaging the object.

Typically, the diameter of a spray droplet of the internal combustion engine is about several μm to several tens of μm. When white irradiation light is emitted, Mie scattering occurs, and the state is observed as shades of gray. On the other hand, since the contrast difference of the observed spray is very large, when normal imaging processing is performed by using the imaging element with a limited dynamic range, the blown-out highlights or the blocked-up shadows occur, and as a result, a tone is checked merely in a partial area for an image. HDR synthesis processing in which continuous imaging is performed with different lens diaphragms and different charge accumulation times, an over-exposed image and an under-exposed image are obtained, and the images are superimposed, can be performed; however, in a case of a spray shape changing at a high speed, deviations occur without fail between images acquired at different timings. In addition, the number of image data acquired per unit time is halved, which is not suitable for the purpose of analyzing changes in fuel spray.

In the first embodiment, imaging is performed by emitting the adjusted irradiation light as illustrated in FIG. 5. The lower diagram of FIG. 6 shows an output value of the R pixel and an output value of the B pixel of the imaging element 220 correlating with a line L shown in the upper diagram of FIG. 6 in the case of emitting the adjusted irradiation light as illustrated in FIG. 5. In FIG. 6, the horizontal axis represents a pixel position correlating with the line L, and the vertical axis represents a pixel value. Here, it is assumed that an accumulated charge amount of each pixel is output with 8 bits.

The B pixel output indicated by the solid line is obtained by plotting the pixel value of the pixel (B pixel) in which the Blue filter is disposed among the Bayer array shown in FIG. 3, according to the pixel position. As illustrated in FIG. 4, the Blue filter transmits the light in the first wavelength band for the most part and blocks the light in the other bands. Therefore, the B pixel mainly receives the reflected light of the irradiation light B emitted from the B light source 323. The intensity of the irradiation light B is adjusted to be low as described above. Therefore, it can be understood that even in an area with a high spray density where the blown-out highlights occur in the normal imaging processing, a proper tone can be obtained without the blown-out highlights, although in an area with a low spray density, electric charge is not accumulated and the blocked-up shadows (pixel value is 0) occur.

The R pixel output indicated by the dotted line is obtained by plotting the pixel value of the pixel (R pixel) in which the Red filter is disposed among the Bayer array illustrated in FIG. 3, according to the pixel position. As illustrated in FIG. 4, the Red filter transmits the light in the second wavelength band for the most part and blocks the light in the other bands. Therefore, the R pixel mainly receives the reflected light of the irradiation light R emitted from the R light source 321. The intensity of the irradiation light R is adjusted to be high as described above. Therefore, it can be understood that in each of right and left areas where the blocked-up shadows occur in the normal imaging processing, images with a low spray density are captured, although in an area with a high spray density, the electric charge is saturated and the blown-out highlights (pixel value is 255) occur.

In the first embodiment, the first layer image data obtained by separating and gathering the outputs of the B pixels from the image data output by the imaging unit 200, and the second layer image data obtained by separating and gathering the outputs of the R pixels from the image data output by the imaging unit 200 are generated. In a case where the outputs of the B pixels are gathered, the pixel values correlating with the positions of the G pixels and the R pixels are omitted, and in a case where the outputs of the R pixels are gathered, the pixel values correlating with the positions of the G pixels and the B pixels are omitted; however, the pixel values correlating with the omission positions may be interpolated using the surrounding pixel values.

In a case of a normal color image, the pixel values of a B layer, a G layer, and an R layer expressed as described above are respectively used as distribution values of three primary colors; however, in the first embodiment, each of the B layer and the R layer is treated as a layer representing the grayscale image. That is, both of the first layer image data and the second layer image data are treated as luminance image data. Then, the first layer image data can be treated as the image data captured with the under-exposed condition, and the second layer image data can be treated as the image data captured with the over-exposed condition. In other words, when the two image data of the first layer image data and the second layer image data are subjected to HDR synthesis, an image in which there is no time lag and both of a high luminance area and a low luminance area have rich tones can be obtained.

Figure 7:
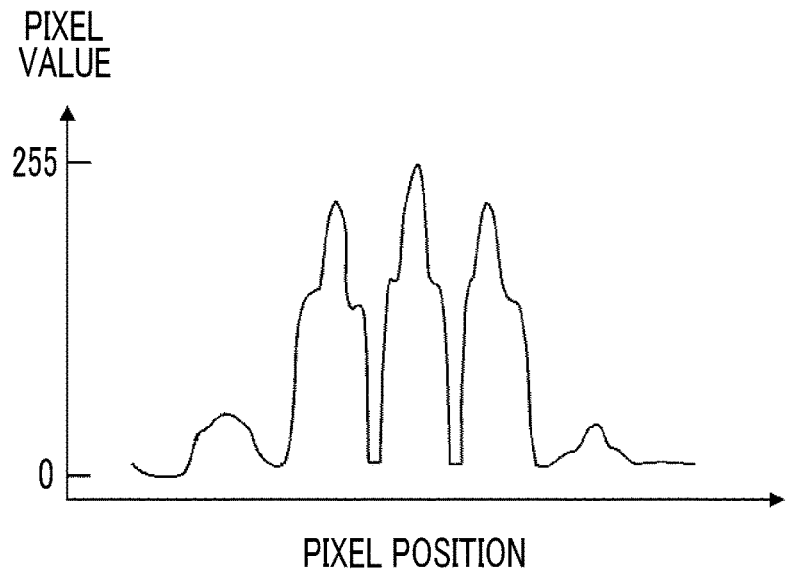
FIG. 7 is a graph illustrating a result of HDR synthesis in a line L.

FIG. 7 is a graph illustrating a result of the HDR synthesis in the line L of FIG. 6. In FIG. 7, similar to the lower diagram of FIG. 6, the horizontal axis represents the pixel position correlating with the line L, and the vertical axis represents the pixel value. Since a variety of technologies are already known in HDR synthesis technology, specific processing is omitted; however, pixel information with the under-exposed condition is intensively used in the low luminance area, and pixel information with the over-exposed condition is intensively used in the high luminance area. In the example of FIG. 7, the pixel value of the first layer image data is intensively used in the high spray density area, and the pixel value of the second layer image data is intensively used in the low spray density area. As a result of the above description, an image in which both of the blown-out highlights and the blocked-up shadows are suppressed is obtained.

As described above, color information is lost by the HDR synthesis processing; however, the color information is not significant in the first place since the fuel spray is set as the object in the first embodiment. Therefore, it can be said that the HDR synthesis processing according to the first embodiment is suitable for an object to which shading information is more useful than color information.

Figure 8:
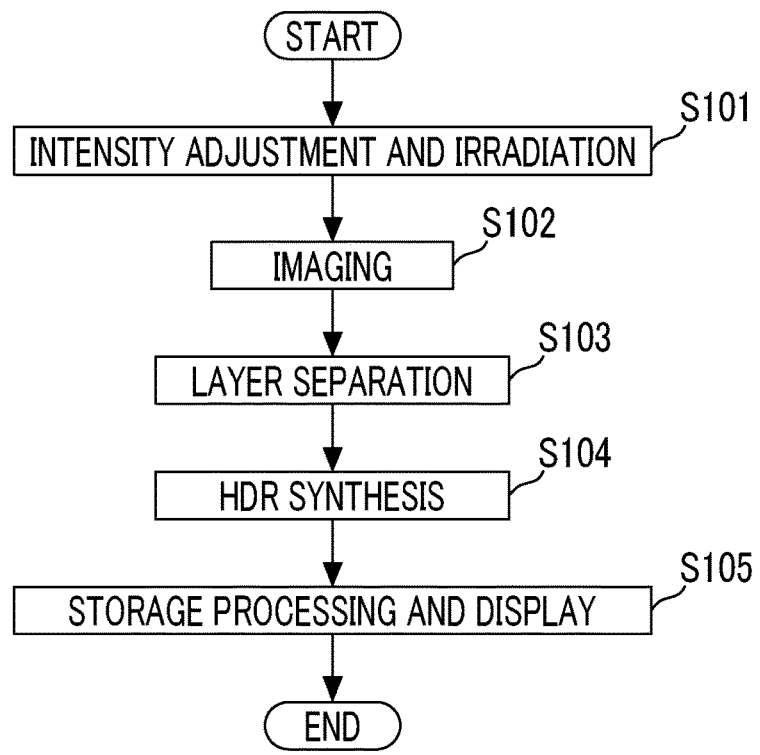
FIG. 8 is a flowchart illustrating a series of imaging steps according to the first embodiment.

FIG. 8 is a flowchart illustrating a series of imaging steps according to the first embodiment. The flow proceeds by sequentially executing a previously adjusted program by the control calculation unit 410 of the control PC 400.

In step S101, the control calculation unit 410 sends a control signal for adjusting the intensity and a control signal for starting the irradiation of the light source 320 to the light source controller 330. Specifically, the control signal is sent such that the intensity of the irradiation light R emitted from the R light source 321 is higher than the intensity of the irradiation light B emitted from the B light source 323. The difference in intensities may be changed according to the degree of ambient light, the brightness of the object itself, the properties of the photoelectric conversion element, or the like.

When the irradiation of the light source 320 is started, the control calculation unit 410 proceeds to step S102 and sends a control signal for starting imaging to the imaging controller 240. When the control signal to start imaging is received, the imaging controller 240 causes the imaging element 220 to execute the imaging processing, causes the image processing unit 230 to execute image processing, and outputs the generated image data to the control PC 400. The control PC 400 acquires the image data from the imaging unit 200. A trigger for starting the imaging may be generated by a user operating a start button or the like.

In step S103, the layer separation unit 411 of the control calculation unit 410 separates the image data acquired from the imaging unit 200 into layers. Specifically, as described above, the outputs of the B pixels are separated and gathered as the first layer image data, and the outputs of the R pixels are separated and gathered as the second layer image data. The HDR synthesis unit 412 of the control calculation unit 410 performs the HDR synthesis of the first layer image data and the second layer image data in step S104. Specifically, as described above, the HDR synthesis is performed by using the first layer image data as the image data captured with the under-exposed condition and the second layer image data as the image data captured with the over-exposed condition.

In step S105, the control calculation unit 410 stores the generated composite image data in the storage device 600 and displays the generated composite image data on the monitor 500 to be visually recognized. The generated composite image data is the grayscale image data, and for example, is stored in the storage device 600 as joint photographic experts group (JPEG) image data. The composite image data is displayed on the monitor 500 as the grayscale image. In a case where imaging is continuously performed, the above-described processing is repeated, and in a case where the imaging is ended, the irradiation by the flash 300 is stopped, and the series of processing is ended.

A second embodiment will be described as a modification example of the first embodiment. FIG. 9 is a schematic view illustrating an overall configuration of an imaging system 100' according to the second embodiment. The imaging system 100' differs from the imaging system 100 in that an intermediate filter 700 is additionally installed and a flash 300' is used instead of the flash 300. Since the other configurations are same as those of the imaging system 100, the same reference numerals are given and the description is omitted. In addition, since the overall system configuration and the structure of the imaging element, or the like are substantially the same unless otherwise mentioned, the description is omitted.

The flash 300' is a device in which the function of independently adjusting the intensity of each color of RGB is omitted in comparison with the flash 300, and which emits the uniform white light. Therefore, with respect to the light source 320, the light source controller 330 controls the intensity of white light and the start and stop of the irradiation in accordance with an instruction from the control calculation unit 410.

The intermediate filter 700 is erected by a tripod 830 between the irradiation window 310 of the flash 300' and the observation window 930 of the internal combustion engine 900. The intermediate filter 700 is an optical filter having an adjusted transmittance with respect to the wavelength, and converts the wavelength characteristic of the incident irradiation light and emits the resultant irradiation light.

FIG. 10 is a graph illustrating the transmission wavelength characteristic of the intermediate filter 700. In FIG. 10, the horizontal axis represents the wavelength (nm) and the vertical axis represents the transmittance. As illustrated in the figure, the intermediate filter 700 has a relatively small transmittance in the first wavelength band which is a wavelength band of wavelengths from 400 nm to 500 nm mainly transmitted by the Blue filter of the imaging element 220, and has a relatively high transmittance in the second wavelength band which is a wavelength band of wavelengths from 600 nm to 700 nm mainly transmitted by the Red filter of the imaging element 220. That is, the intermediate filter 700 is set such that the transmittance of the second wavelength band is higher than the transmittance of the first wavelength band.

When the object is irradiated with the irradiation light which is the white light through the intermediate filter 700 set as described above, the same effect can be obtained as in a case where the irradiation is performed by adjusting the intensity of the RGB of the light source 320 in the imaging system 100'. The intermediate filter 700 is not limited to the case of being erected by the tripod 830 and may be installed in front of the observation window 930 or the observation window 930 itself may be formed of an optical material having the above described characteristics.

FIG. 11 is a flowchart illustrating a series of imaging steps using the imaging system 100'. In step S100, the user or the like installs the intermediate filter 700 between the flash 300' and the internal combustion engine 900. By operating an operation member, the user or the like informs the control calculation unit 410 that the installation is completed. In step S101, to the light source controller 330, the control calculation unit 410 sends a control signal for adjusting the intensity of the uniform white light and a control signal for starting the irradiation of the light source 320. Since the processing in step S102 and subsequent steps is same as the processing of the flow illustrated in FIG. 8, the description thereof will be omitted.

In the embodiments of the disclosure described above, the HDR synthesis is performed on two layers of the R layer and the B layer; however, the HDR synthesis may also be performed using the G layer. When the G layer is a target of the synthesis as well, a richer tone expression may be possible. The wavelength band of wavelengths from 400 nm to 500 nm mainly transmitted by the Blue filter is made to correlate with the first wavelength band and the wavelength band of wavelengths from 600 nm to 700 nm mainly transmitted by the Red filter is made to correlate with the second wavelength band; however, the combination may be varied depending on the properties of the object or the like. For example, the wavelength band of wavelengths from 400 nm to 500 nm mainly transmitted by the Blue filter may be made to correlate with the second wavelength band such that the irradiation light in the blue wavelength band is strongly emitted on the object. In the above-described embodiments, the wavelengths in the first wavelength band and the second wavelength band are set so as not to overlap each other; however, the wavelengths in the first wavelength band and the second wavelength band may be set so as to partially overlap each other.

In the embodiments described above, an example in which RGB filters are arranged for each pixel for a commonly used imaging element has been described. On the other hand, in a case where optical filters other than the RGB are arranged in pixels, the intensity of each color of the irradiation light or the transmission wavelength characteristic of the intermediate filter may be set according to the transmission wavelength characteristics of the arranged optical filters.

In the embodiments described above, the configurations in which the imaging system 100 includes the control PC 400, the flash 300 (flash 300') is connected to the control PC 400, and the control PC 400 controls the entire system have been described. On the other hand, each of the constituent elements may be independent. For example, as long as the flash 300 includes an adjustment knob that adjusts the irradiation intensity of each color and an irradiation start button, the user may operate the adjustment knob and the irradiation start button to irradiate the object in case of starting a series of operations. As long as the processing up to the generation of the image data is executed by the imaging unit 200 alone, the user may give an imaging start instruction to the imaging unit 200, and for example, the generated image data may be transferred to the control PC 400 through a memory card.

In the embodiments described above, the case of generating still image data has been described; however, video data may be generated by executing the HDR synthesis processing on the sequentially acquired image data. According to the embodiments, in a case where the still image data is generated, the number of image data acquired per unit time can be increased, and, in a case where the video data is generated, the frame rate can be increased.

In the embodiments described above, as an example in which a greater effect can be obtained as compared with the related art, the fuel spray of the internal combustion engine is used as an object; however, the object is not limited thereto. The imaging method according to the embodiments is effective for an object having a large contrast difference.

What is claimed is:

1. An imaging method comprising:
   disposing an intermediate filter having a transmittance in a second wavelength band higher than a transmittance in a first wavelength band, between a light source and an object, the first wavelength band being a wavelength band correlating with a first filter having a first transmission wavelength characteristic among optical filters disposed in each of a plurality of pixels constituting an imaging element in an imaging device, and the second wavelength band being a wavelength band correlating with a second filter having a second transmission wavelength characteristic different from the first transmission wavelength characteristic;
   imaging the object irradiated with irradiation light from the light source which has been transmitted through the intermediate filter by using the imaging element; and
   generating composite image data by high dynamic range synthesis of first layer image data and second layer image data, among image data of the object output by the imaging element, the first layer image data being image data generated as a grayscale image based on an output signal of a pixel in which the first filter is disposed, and the second layer image data being image data generated as a grayscale image based on an output signal of a pixel in which the second filter is disposed.

2. The imaging method according to claim 1, wherein:
   the first filter is one of an Red filter, a Green filter, and a Blue filter; and
   the second filter is one different from the first filter among the Red filter, the Green filter, and the Blue filter.

3. The imaging method according to claim 2, wherein:
   the first filter is the Green filter or the Blue filter; and
   the second filter is the Red filter.

4. The imaging method according to claim 1, wherein the object is fuel spray of an internal combustion engine.

5. The imaging method according to claim 1, further comprising:
   converting the generated composite image data into display signals; and
   displaying the generated composite image data on a monitor.

* * * * *